(12) United States Patent
Kawashiro

(10) Patent No.: US 8,071,472 B2
(45) Date of Patent: Dec. 6, 2011

(54) SEMICONDUCTOR DEVICE WITH SOLDER BALLS HAVING HIGH RELIABILITY

(75) Inventor: Fumiyoshi Kawashiro, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 12/706,440

(22) Filed: Feb. 16, 2010

(65) Prior Publication Data

US 2010/0144136 A1     Jun. 10, 2010

Related U.S. Application Data

(62) Division of application No. 11/553,916, filed on Oct. 27, 2006, now Pat. No. 7,701,061.

(30) Foreign Application Priority Data

Oct. 28, 2005  (JP) .................................. 2005-314150

(51) Int. Cl.
    *H01L 21/44*  (2006.01)
(52) U.S. Cl. ........ 438/615; 438/653; 438/612; 438/661; 257/E21.51
(58) Field of Classification Search .................. 438/615, 438/653, 612, 661; 257/E21.508
    See application file for complete search history.

(56) References Cited

U.S. PATENT DOCUMENTS

| | | | |
|---|---|---|---|
| 6,082,610 A | 7/2000 | Shangguan et al. | |
| 6,316,726 B1 | 11/2001 | Hidaka et al. | |
| 6,638,847 B1 | 10/2003 | Cheung et al. | |
| 6,916,732 B2 | 7/2005 | Wu et al. | |
| 7,034,402 B1 | 4/2006 | Seshan | |
| 7,122,894 B2 | 10/2006 | Sugimoto et al. | |
| 7,265,044 B2 | 9/2007 | Ohta et al. | |
| 7,410,833 B2 * | 8/2008 | Fogel et al. | 438/123 |
| 7,547,623 B2 * | 6/2009 | Mis et al. | 438/612 |
| 2001/0040290 A1 | 11/2001 | Sakurai et al. | |
| 2003/0127734 A1 * | 7/2003 | Lee et al. | 257/737 |
| 2005/0006789 A1 * | 1/2005 | Tomono et al. | 257/778 |
| 2006/0030139 A1 * | 2/2006 | Mis et al. | 438/612 |
| 2006/0043570 A1 | 3/2006 | Muramatsu et al. | |
| 2006/0060987 A1 | 3/2006 | Chen et al. | |
| 2006/0102384 A1 * | 5/2006 | Watanabe et al. | 174/256 |
| 2006/0131748 A1 | 6/2006 | Seshan | |
| 2007/0131141 A1 * | 6/2007 | Masatoki et al. | 106/287.16 |

FOREIGN PATENT DOCUMENTS

| | | |
|---|---|---|
| JP | 5-50286 A | 3/1993 |
| JP | 2001-156207 A | 6/2001 |
| JP | 2002-016211 A | 1/2002 |
| JP | 2002-185130 A | 6/2002 |

OTHER PUBLICATIONS

Japanese Office Action, dated May 31, 2011, issued in Application No. 2005-314150.

* cited by examiner

*Primary Examiner* — Nitin Parekh
(74) *Attorney, Agent, or Firm* — Sughrue Mion, PLLC

(57) ABSTRACT

A semiconductor device includes a substrate, a metal layer, an alloy layer and a Sn—Ag—Cu-based solder ball. The metal layer is configured to be formed on the substrate. The alloy layer is configured to be formed on the metal layer. The Sn—Ag—Cu-based solder ball is configured to be placed on the alloy layer. The alloy layer includes Ni and Zn as essential elements.

9 Claims, 9 Drawing Sheets

SEMICONDUCTOR DEVICE WITH SOLDER BALLS HAVING HIGH RELIABILITY

CROSS REFERENCE TO RELATED APPLICATIONS

This application is a divisional of U.S. patent application Ser. No. 11/553,916, filed Oct. 27, 2006, which claims priority to Japanese Patent Application No. 2005-314150, filed Oct. 28, 2005, the contents of all of which are incorporated herein by reference.

BACKGROUND OF THE INVENTION

1. Field of the Invention

The present invention relates to a semiconductor device. More particularly, the present invention relates to a semiconductor device with solder balls as external connection terminals having high reliability.

2. Description of the Related Art

Conventionally, Sn—Pb eutectic solder has been used. However, since a lead-free solder is requested, various solders are developed.

For example, Japanese Laid-Open Patent Application JP-A-Heisei, 5-50286 discloses one of such solders. The solder (hereafter, referred to as Sn—Ag—Cu-based Solder) is composed of: Ag between 3.0 and 5.0 weight %; Cu between 0.5 and 3.0 weight %; and Sn of the remainder. The solder ball of such composition is actually used as the external connection terminal of BGA (Ball Grid Array).

FIG. 1 is a sectional view showing a conventional semiconductor device. As shown in FIG. 1, in the conventional semiconductor device, a solder resist 103 having an opening is formed on a substrate 101. A Cu layer 105, a Ni layer 107 and an alloy layer 109 are laminated in turn inside this opening. The alloy layer 109 includes Cu, Ni and Sn as essential components. A Sn—Ag—Cu-based solder 111 is installed on the surface of the alloy layer 109.

FIG. 2 is a sectional view showing an example where the conventional semiconductor device is installed on a mount substrate. As shown in FIG. 2, the mount substrate has a solder resist 123 having an opening on a substrate 121. A Cu layer 125 is formed inside this opening. When the Sn—Ag—Cu-based solder 111 is mounted, an alloy layer 129 that includes Cu and Sn is formed between the Cu layer 125 and the Sn—Ag—Cu-based solder 111. The Cu layer 125 and the Sn—Ag—Cu-based solder 111 are bonded through this alloy layer 129.

On the other hand, Japanese Laid-Open Patent Application JP-P2001-156207A discloses a semiconductor device in which Sn—Zn-based solder balls are used as external connection terminals.

However, we have now discovered that the conventional technique has a room to be improved with regard to the following points.

Firstly, when the Sn—Ag—Cu-based solder described in the JP-A-Heisei, 5-50286 was used as the external connection terminals of the BGA, the impact resistance of the alloy layer 109, which included Cu, Ni and Sn and served as the solder bonding portion on the semiconductor device side, was lower than that of the conventional Sn—Pb eutectic solder. Thus, there was a case that the connection reliability was reduced.

Secondly, when the Sn—Zn-based solder described in the JP-P2001-156207A was used as the external connection terminals, the impact resistance of the alloy layer serving as the solder bonding portion on the semiconductor device side was improved. However, since the Sn—Zn-based solder was low in humidity resistance, there was a case that the connection reliability for a long term could not be maintained. Moreover, since the Zn included in the Sn—Zn-based solder was very high in reactivity with Cu, an alloy layer (Zn—Cu alloy layer) having a thick thickness is formed on the bonding surface. For this reason, the impact resistance of the alloy layer serving as the solder bonding portion on the mount substrate side was low, and there was a case that it was stripped when external force was applied. In this way, the mount substrate requires the limit even on the metal material of the portion bonded to the solder.

For this reason, a semiconductor device having solder balls as external connection terminals, which is superior in connection reliability to a mount substrate and superior even in a connection reliability for a long term, is desired.

SUMMARY OF THE INVENTION

In order to achieve an aspect of the present invention, the present invention provides a semiconductor device including: a substrate; a metal layer configured to be formed on the substrate; a alloy layer configured to be formed on the metal layer; and a Sn—Ag—Cu-based solder ball configured to be placed on the alloy layer, wherein the alloy layer includes Ni and Zn as essential elements.

In order to achieve another aspect of the present invention, the present invention provides a method of manufacturing a semiconductor device including: (a) forming a solder resist having an opening on a substrate; (b) forming a Ni inclusion plating layer inside the opening; and (c) installing a Sn—Ag—Cu-based solder ball through an alloy layer, which includes Ni and Zn as essential elements, on the Ni inclusion plating layer.

According to the present invention, since the alloy layer includes Ni and Zn, the impact resistance is high, and the reliability of the connection between the metal layer and solder ball is superior. Moreover, since the Sn—Ag—Cu-based solder ball is used as the solder ball, the connection is strong against heat and humidity, and the reliability of the connection for a long term can be maintained. Furthermore, the flexibility of the selection of the metal material in the mount substrate is improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor device according to the present invention will be described below with reference to the attached drawings. Incidentally, in all of the drawings, the similar symbols are assigned to the similar components, and their explanations are properly omitted.

Figure 3:
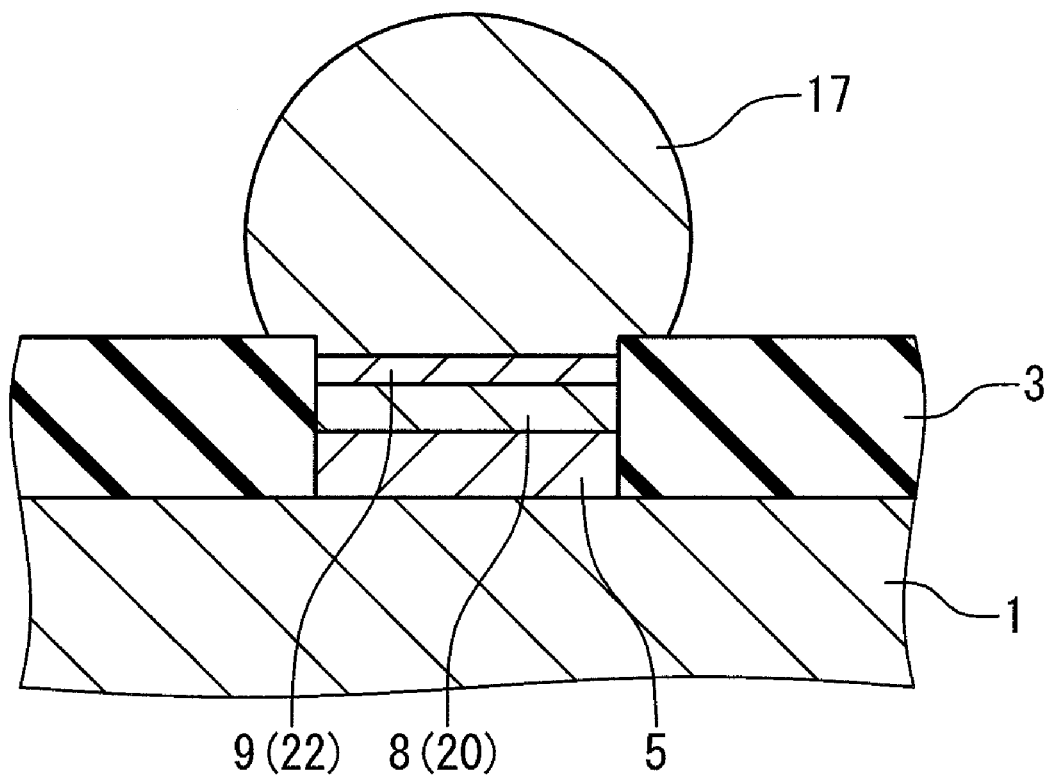
FIG. 3 is a sectional view showing the semiconductor device of the first embodiment according to the present invention.

FIG. 3 is a sectional view showing the semiconductor device of an embodiment according to the present invention. The semiconductor device in this embodiment includes: a substrate 1; metal layers formed on the substrate 1; alloy layers formed on the metal layers; and a Sn—Ag—Cu-based solder ball 17 installed on the surface of the metal layer. The metal layers are composed of a Cu layer 5 and a Ni layer 8 (20). The alloy layer is composed of a Ni—Zn alloy layer 9 and/or a Ni—Au—Zn alloy layer 22 formed on the metal layers.

The alloy layer includes Ni and Zn as essential components and is composed of an alloy of Ni and Zn, an alloy of Ni, Au and Zn, or an alloy of Ni, Pd and Zn, or the like. This embodiment uses the alloy layer (hereafter, also referred to as Ni—Zn inclusion alloy layer) that includes Ni and Zn as the essential components. Thus, the impact resistance is high, and the connection reliability between the metal layer and the solder ball is excellent. Incidentally, in this embodiment, the layer formed between the metal layer and the Sn—Ag—Cu-based solder ball 17 is described as the alloy layer. However, this alloy layer may be the layer composed of intermetallic compound.

Also, the thickness of the Ni—Zn inclusion alloy layer is between about 0.02 μm and 0.3 μm. The thickness of the alloy layer is verified by the observation that uses an electron microscope. In this embodiment, since the alloy layer is composed of the Ni—Zn inclusion alloy, it can be the thin layer within the foregoing value range. Thus, the bonding property to the Sn—Ag—Cu-based solder ball is excellent, the impact resistance is high, and the connection reliability to the metal layer is also excellent.

The detail of this embodiment will be described below by using the first to third embodiments. Incidentally, this embodiment is described by using an example that an IC package on which a semiconductor chip is mounted is used as a semiconductor device and that this IC package is mounted on a printed circuit board.

First Embodiment

As shown in FIG. 3, in the semiconductor device of the first embodiment, a solder resist 3 having an opening is formed on the substrate 1. A Cu layer 5, a Ni layer 8 and an alloy layer are laminated in turn inside this opening.

In this embodiment, the alloy layer is the Ni—Zn alloy layer 9 composed of Ni and Zn. The Sn—Ag—Cu-based solder ball 17 is installed on the surface of the Ni—Zn alloy layer 9.

Figure 4:
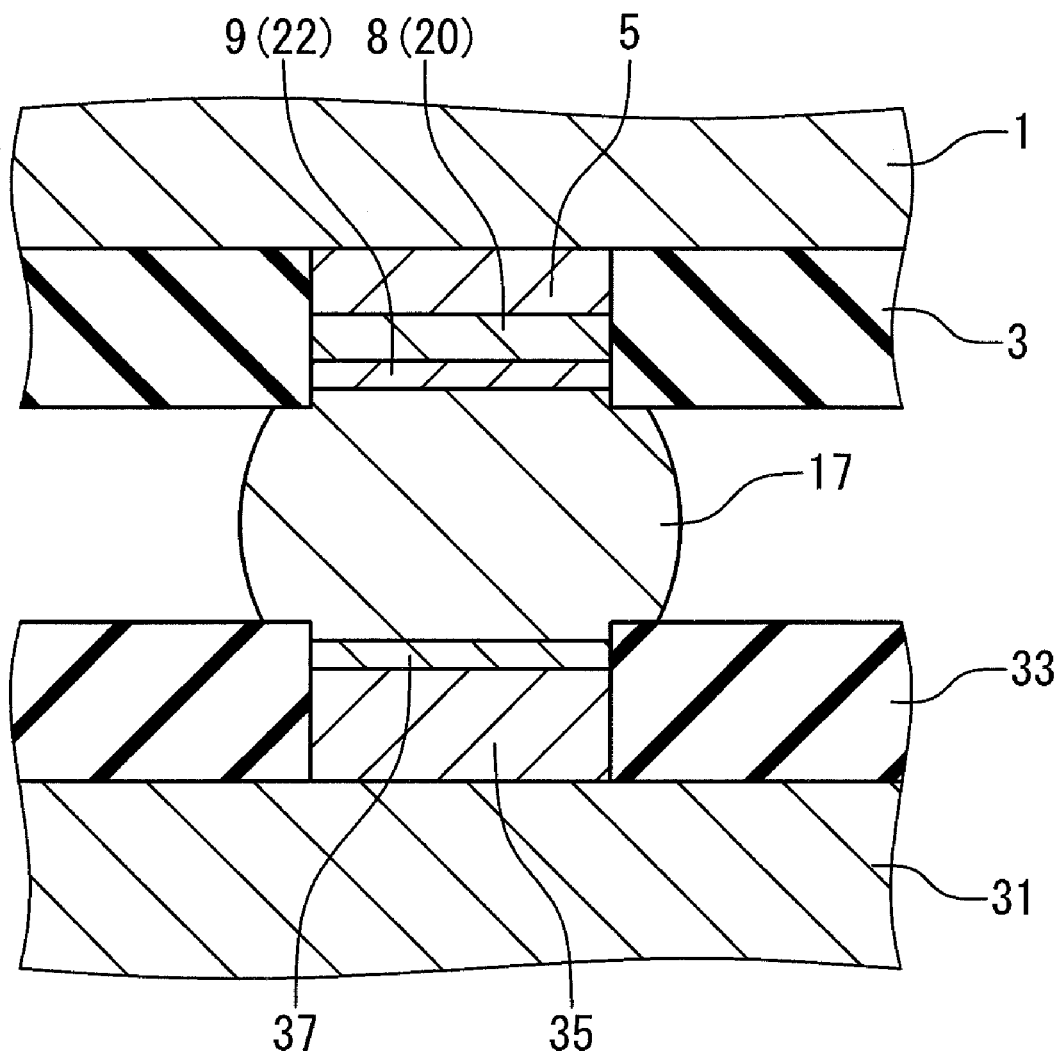
FIG. 4 is a sectional view showing an example that the semiconductor device of the first embodiment is installed on a mount substrate.

FIG. 4 is a sectional view showing an example that the semiconductor device of the first embodiment is installed on a mount substrate.

As shown in FIG. 4, a solder resist 33 having an opening is formed on a substrate 31, in the mount substrate. A Cu layer 35 and an alloy layer (hereafter, referred to as a Cu—Sn alloy layer 37) composed of Cu and Zn are laminated inside this opening. The Sn—Ag—Cu-based solder ball 17 is adhered through the Cu—Sn alloy layer 37 to the Cu layer 35. In this way, the Cu—Sn alloy layer 37 is formed between the mount substrate and the Sn—Ag—Cu-based solder ball 17. Thus, the connection reliability between the semiconductor device and the mount substrate is excellent.

A method of manufacturing the semiconductor device of the first embodiment as mentioned above will be described below with reference drawings. FIGS. 5 to 8 are sectional views showing the method of manufacturing the semiconductor device of the first embodiment.

Figure 5:
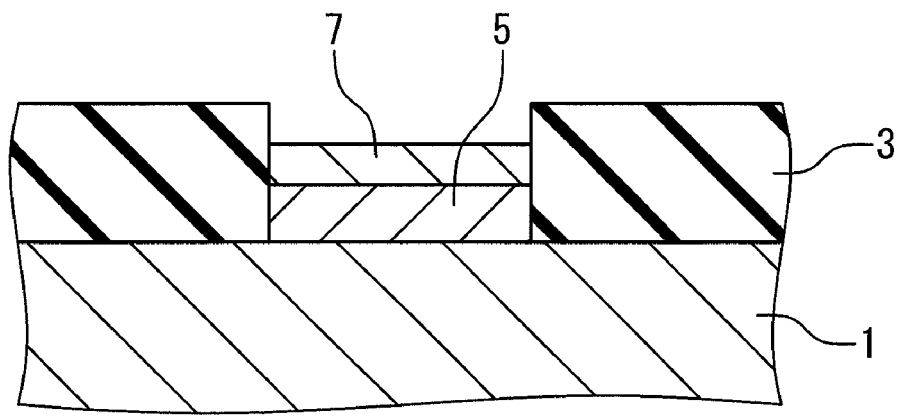
FIGS. 5 to 8 are sectional views showing a method of manufacturing the semiconductor device of the first embodiment.

The method of manufacturing the semiconductor device of the first embodiment includes the following steps of:

(1) forming the solder resist 3 having the opening on the substrate 1 (FIG. 5).

Figure 7:
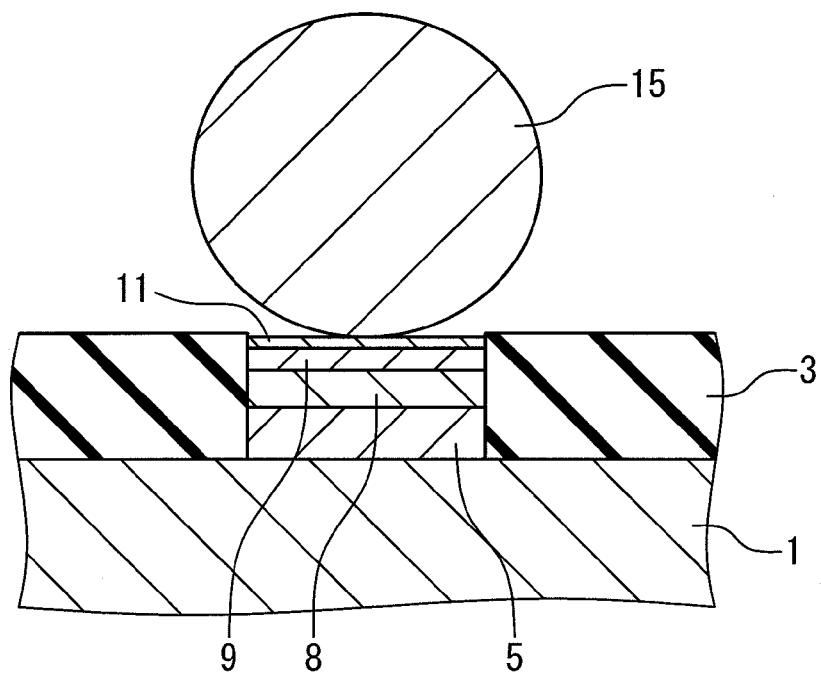
Figure 8:
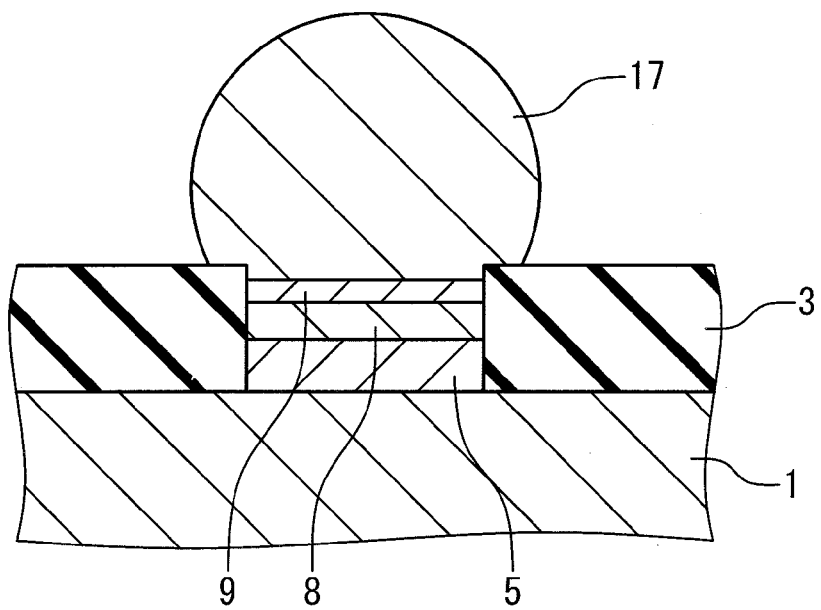

(2) forming a Ni inclusion plating layer (the Cu layer 5 and the Ni layer 7) inside the opening (FIG. 5);

(3) installing the Sn—Ag—Cu-based solder ball 17 through the alloy layer (the Ni—Zn alloy layer 9), which includes Ni and Zn as the essential components, on the Ni inclusion plating layer (FIGS. 7 to 8).

The details of the method of manufacturing the semiconductor device are follows.

At first, the solder resist 3 having the opening at a predetermined position is formed on the substrate 1 by using usual exposing/developing techniques. Then, the Cu layer 5 and the Ni layer 7 are plated in turn on the surface of the substrate 1 that is exposed to the bottom of this opening, and the Ni inclusion plating layer is formed (FIG. 5).

Figure 6:
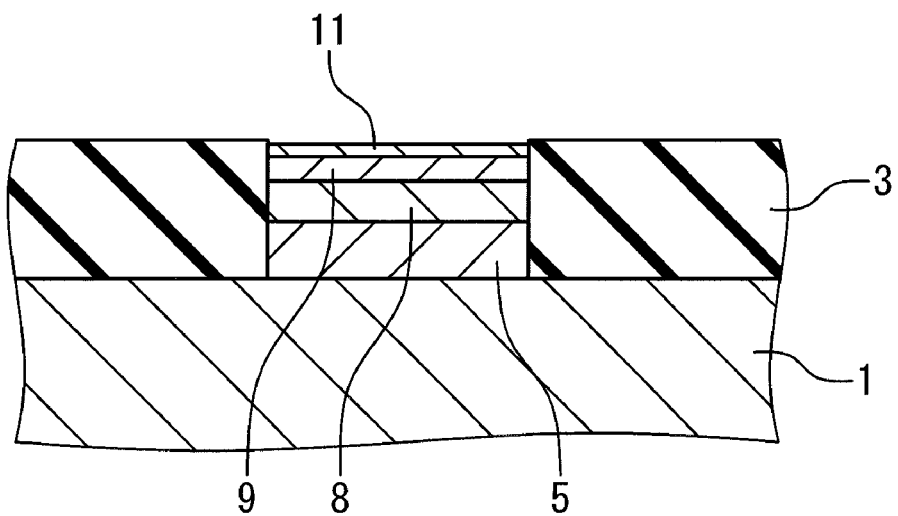

Next, a Zn inclusion solder layer is formed on the surface of the Ni layer 7, and a heating process is performed thereon. Specifically, a usual solder plating is used for carrying out a Sn—Zn solder plating. Consequently, the alloy layer composed of Ni and Zn (the Ni—Zn alloy layer 9) is composed of Ni of the Ni layer 7 and Zn of the Sn—Zn solder plating (FIG. 6). The solder plating is carried out in a soldering bath at about 350° C. (degrees centigrade). Consequently, the pad where the Cu layer 5, the Ni layer 8, the Ni—Zn alloy layer 9 and a Sn layer 11 are laminated in turn inside the opening (FIG. 6). The formation of the Ni—Zn alloy layer 9 is verified by an energy-dispersive X-ray spectroscopy (EDS).

Next, an oxide film on the pad surface is removed by flux (surfactant). Then, a Sn—Ag—Cu-based solder ball 15 is installed on the pad surface (FIG. 7). Next, the solder is melted by holding it at a temperature equal to or higher than a melting point (about 250° C. (degrees centigrade)) for about 30 seconds. The Sn layer on the pad and the Sn in the solder ball 15 are fused (FIG. 8). Consequently, the Sn—Ag—Cu-based solder ball 17 and the metal layers (the Ni layer 8 and the Cu layer 5) are connected through the Ni—Zn alloy layer 9.

The layer configuration is the lamination structure of the Cu layer 5, the Ni layer 8 and the Ni—Zn alloy layer 9 from a Cu electrode side.

Then, the Sn—Ag—Cu-based solder ball 17 is installed on the surface of the Ni—Zn alloy layer 9.

The effect of the first embodiment will be described below.

According to the semiconductor device in the first embodiment, since the alloy layer is composed of Ni and Zn, the impact resistance is high, and the connection reliability between the metal layer and the solder ball is excellent. Moreover, since the Sn—Ag—Cu-based solder ball is used as the solder ball, this is strong against heat and humidity, and the connection reliability for a long term can be maintained. Moreover, the flexibility of the selection of the metal material in the mount substrate is improved.

Also, the layer thickness of the alloy layer that includes Ni and Zn as the essential components is between 0.02 μm and 0.3 μm. Thus, the impact resistance is high, and the connection reliability is excellent.

On the other hand, in a conventional semiconductor device (FIGS. 1 and 2), an alloy layer 109 including Cu, Ni and Sn is formed, and this layer thickness is between about 1 μm and 2 μm. Thus, the alloy layer 9 is low in the impact resistance, and there was a case that the connection reliability was reduced.

On the contrary, the alloy layer in this embodiment includes Ni and Zn as the essential components. For this reason, the alloy layer can be the thin layer within the foregoing value range. Thus, the bonding property to the Sn—Ag—Cu-based solder ball is excellent, and the impact resistance is high. Hence, the connection reliability of the semiconductor device is also excellent.

Second Embodiment

A semiconductor device in the second embodiment differs from the semiconductor device in the first embodiment in that an alloy layer is an alloy layer (Ni—Au—Zn alloy layer 22) composed of Ni, Au and Zn.

A method of manufacturing the semiconductor device of the second embodiment as mentioned above will be described below with reference to drawings. FIGS. 9 to 13 are sectional views showing the method of manufacturing the semiconductor device of the second embodiment.

Figure 9:
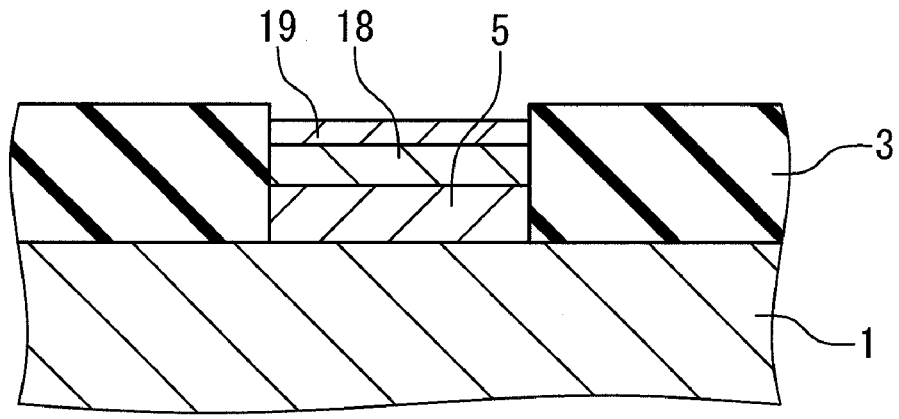
FIGS. 9 to 13 are sectional views showing the method of manufacturing the semiconductor device of the second embodiment.

The method of manufacturing the semiconductor device of the second embodiment includes the following steps of:
(1) forming the solder resist 3 having the opening on the substrate 1 (FIG. 9);
(2) forming a Ni inclusion plating layer (the Cu layer 105, a Ni layer 18 and an Au layer 19) inside the opening (FIG. 9); and
(3) installing the Sn—Ag—Cu-based solder ball 17 through the alloy layer (the Ni—Au—Zn alloy layer 22), which includes Ni and Zn as the essential components, on the Ni inclusion plating layer (FIGS. 10 to 13).

The details of the method of manufacturing the semiconductor device are follows.

At first, the solder resist 3 having the opening at the predetermined position is formed on the substrate 1 by using the usual exposing/developing techniques. Then, the Cu layer 5, the Ni layer 18 and the Au layer 19 are plated in turn on the surface of the substrate 1 that is exposed to the bottom of this opening, and the plating layer that includes Ni and Au is formed (FIG. 9).

Figure 10:
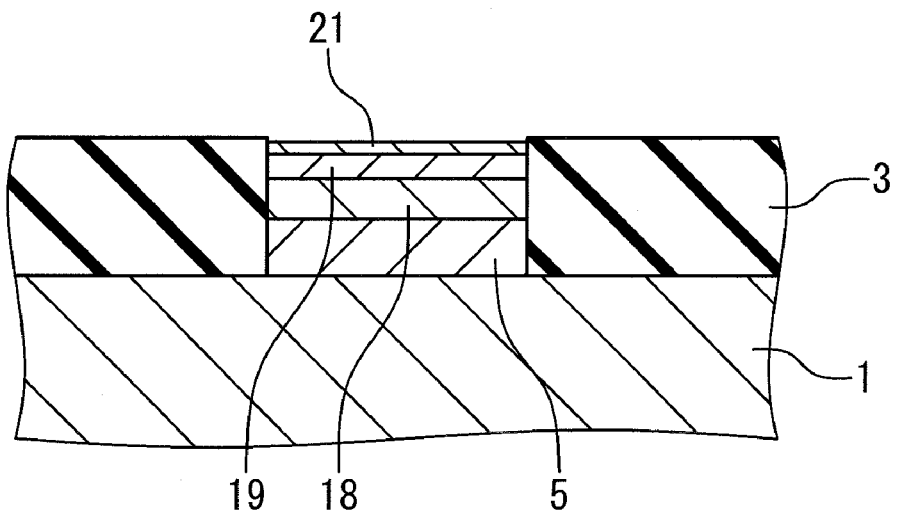
Figure 11:
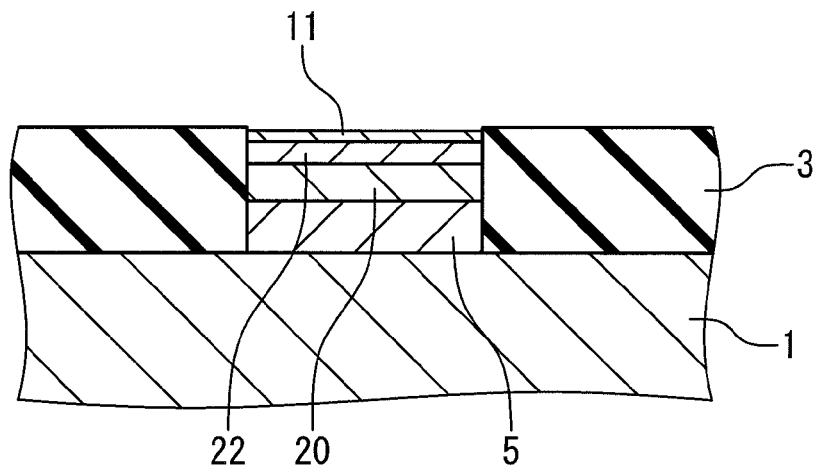

Next, the Zn inclusion solder layer is formed on the surface of the Au layer 19, and a heating process is performed thereon. Specifically, a Sn—Zn solder paste 21 is printed on the surface of the Au layer 19 (FIG. 10). Then, it is heated at about 250° C. (degrees centigrade) for 30 seconds, and the solder is melted. Consequently, the Ni—Au—Zn alloy layer 22 is formed as the alloy layer (FIG. 11). Consequently, the pad where the Cu layer 5, the Ni layer 20, the Ni—Au—Zn alloy layer 22 and the Sn layer 11 are laminated in turn inside the opening (FIG. 11). The formation of the Ni—Au—Zn alloy layer 22 is verified by the energy-dispersive X-ray spectroscopy (EDS).

Figure 12:
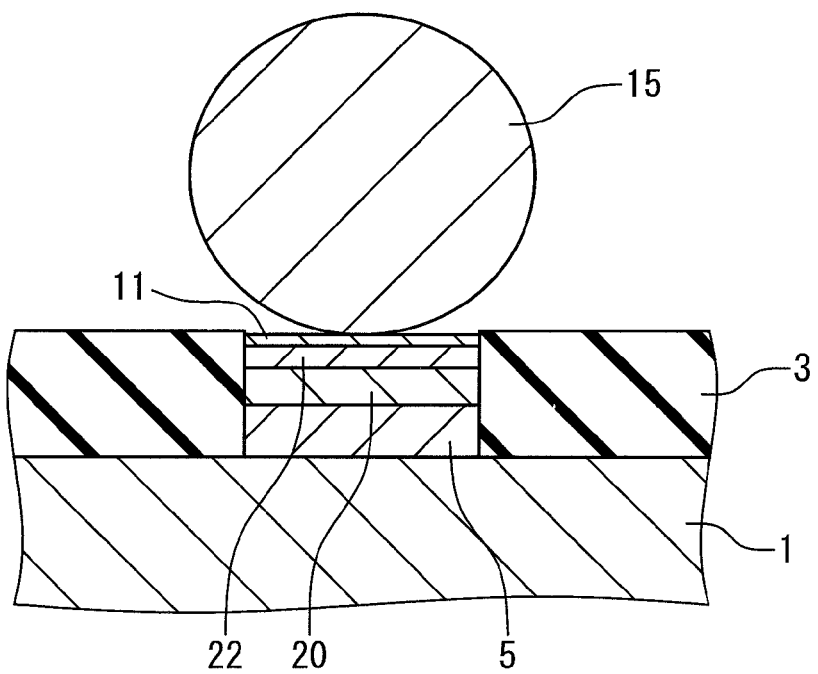
Figure 13:
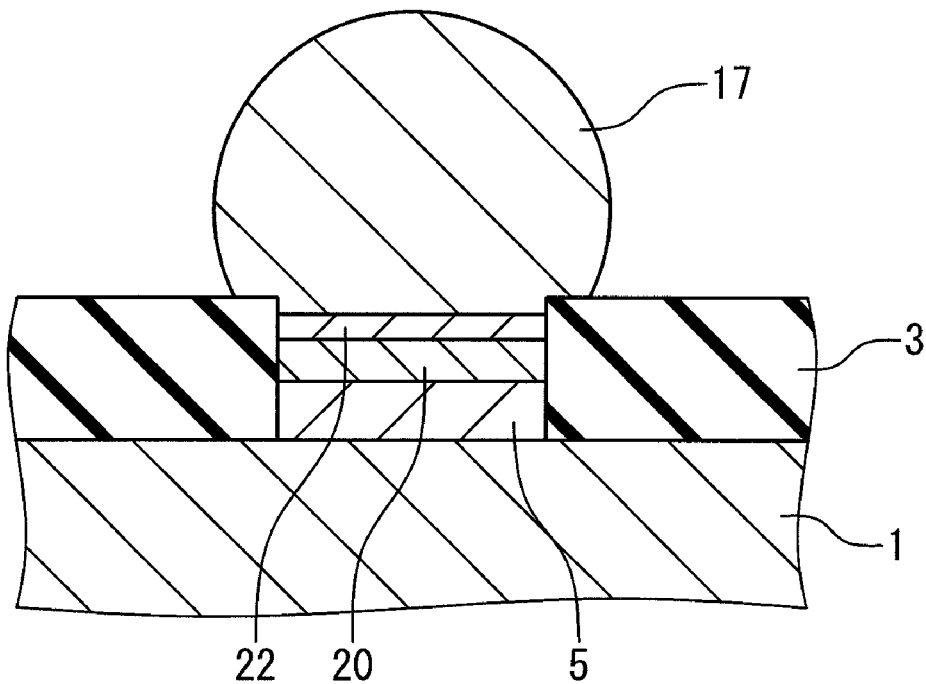

Next, the oxide film on the pad surface is removed by the flux (surfactant), and the Sn—Ag—Cu-based solder ball 15 is installed on the pad surface (FIG. 12). Next, the solder is melted by holding it at the temperature equal to or higher than the melting point (about 250° C. (degrees centigrade)) for about 30 seconds, and the Sn layer 11 on the pad and the Sn in the solder ball are fused (FIG. 13).

The layer configuration is the lamination structure of the Cu layer 5, the Ni layer 20 and the Ni—Au—Zn alloy layer 22 from the Cu electrode side. The Sn—Ag—Cu-based solder ball 17 is installed on the surface of this Ni—Au—Zn alloy layer 22.

The effect of the second embodiment as mentioned above will be described below.

The semiconductor device in the second embodiment can obtain the effect of the first embodiment. Moreover, since the Ni—Zn inclusion alloy constituting the alloy layer is the Ni—Au—Zn alloy, the impact resistance is further excellent, and the connection reliability between the metal layer and the solder ball is further excellent.

Third Embodiment

A semiconductor device in the third embodiment differs from the semiconductor device in the first embodiment in that the alloy layer is the Ni—Au—Zn alloy layer 22.

Figure 14:
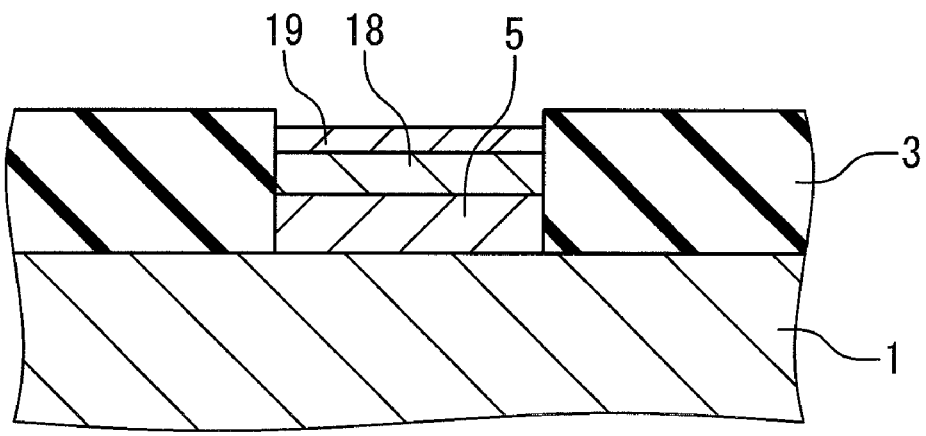
FIGS. 14 to 16 are sectional views showing the method of manufacturing the semiconductor device of the third embodiment.
Figure 15:
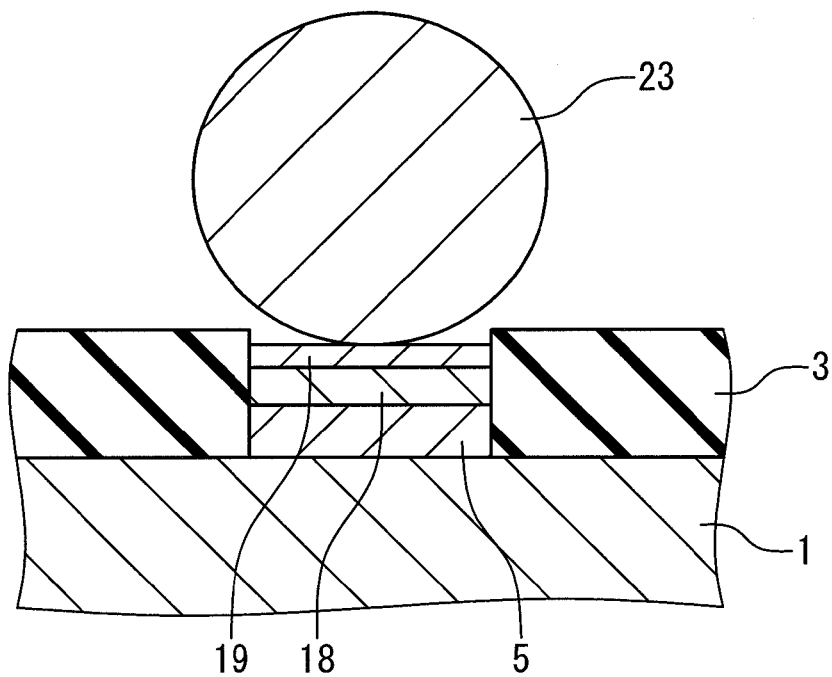
Figure 16:
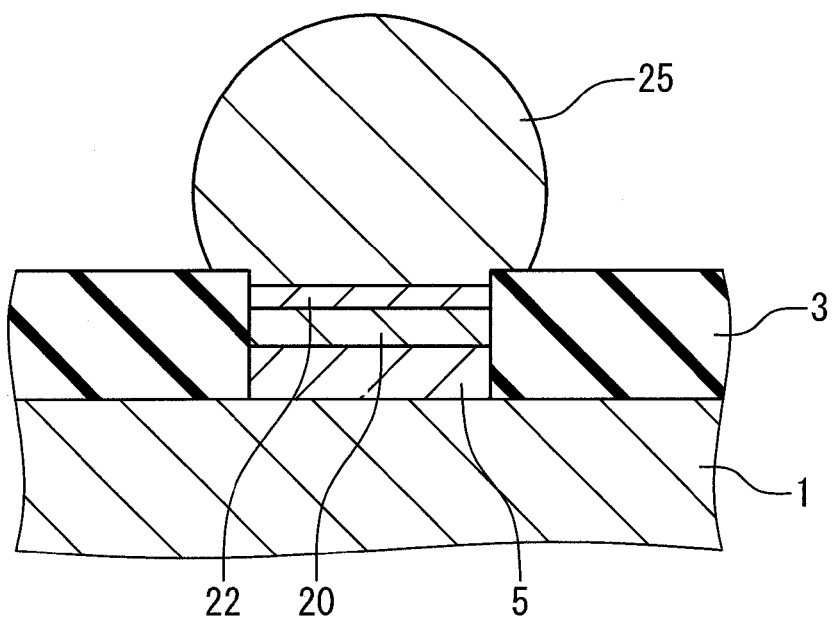

A method of manufacturing the semiconductor device of the third embodiment as mentioned above will be described below with reference to drawings. FIGS. 14 to 16 are sectional views showing the method of manufacturing the semiconductor device of the third embodiment.

The method of manufacturing the semiconductor device of the third embodiment includes the following steps of:
(1) forming the solder resist 3 having the opening on the substrate 1 (FIG. 14);
(2) forming the Ni inclusion plating layer (the Cu layer 5, the Ni layer 18 and the Au layer 19) inside the opening (FIG. 14); and
(3) installing a Sn—Ag—Cu-based solder ball 25 through the alloy layer (the Ni—Au—Zn alloy layer 22), which includes Ni and Zn as the essential components, on the Ni inclusion plating layer (FIGS. 15 and 16).

The details of the method of manufacturing the semiconductor device are follows.

At first, the solder resist 3 having the opening at the predetermined position is formed on the substrate 1 by using the usual exposing/developing techniques. Then, the Cu layer 5, the Ni layer 18 and the Au layer 19 are plated in turn on the surface of the substrate 1 that is exposed to the bottom of this opening, and the plating layer that includes Ni and Au is formed (FIG. 14).

Next, the oxide film on the surface of the Au layer 19 is removed by the flux (surfactant), and a Sn—Ag—Cu-based solder ball 23 is placed on the surface of the Au layer 19 (FIG. 15). This Sn—Ag—Cu-based solder ball 23 includes Zn at an amount of about 1 weight %. Next, while it is held at the temperature equal to or higher than the melting point (about 250° C. (degrees centigrade)) for 30 seconds, a heating process is performed thereon. Consequently, the solder is melted. Then, the Ni—Au—Zn alloy layer 22 is constituted by the partial Ni of the Ni layer 18, the Au layer 19 and the Zn included in the Sn—Ag—Cu-based solder ball 23 (FIG. 16). The formation of the Ni—Au—Zn alloy layer 22 is verified by the energy-dispersive X-ray spectroscopy (EDS).

The layer configuration is the lamination structure of the Cu layer 5, the Ni layer 20 and the Ni—Au—Zn alloy layer 22, from the Cu electrode side. Moreover, the Sn—Ag—Cu-based solder ball 25 is installed on the surface of the Ni—Au—Zn alloy layer 22.

The effect of the third embodiment as mentioned above will be described below.

The semiconductor device in the third embodiment can obtain the effect of the first embodiment. Similarly to the second embodiment, the alloy layer is composed of the Ni—Au—Zn compound. Thus, the effect of the second embodiment is also obtained. Moreover, the Sn—Ag—Cu-based solder ball 23 that includes Zn at the amount of about 1 weight % is used as the supply source of Zn. Hence, the step to form the alloy layer can be simplified.

As mentioned above, the embodiments of the present invention have been described by referring to the drawings. However, they are the exemplification of the present invention. The various configurations other than the above-mentioned configurations can be employed.

The above-mentioned embodiments are described by using the example where the IC package on which the semiconductor chip is mounted is used as the semiconductor device, and this IC package is mounted on the printed circuit board. However, the semiconductor chip is used as the semiconductor device, and this semiconductor chip can be mounted on a package substrate.

Also, the third embodiment is explained by using the example where the Ni—Au—Zn alloy layer is formed as the alloy layer. However, by installing the Sn—Ag—Cu-based solder ball 23, which includes Zn, on the surface of the Ni layer 18, it is possible to form the alloy layer made of Ni and Zn on the interface between them. According to this method, the step to form the alloy layer can be further simplified.

EXPERIMENT

Experiment 1

In accordance with the first embodiment, the semiconductor device was manufactured under the following conditions.
(a) Sn—Zn solder plating condition: 350° C. (degrees centigrade) Soldering Bath
(b) Solder melting condition of Sn—Ag—Cu-based solder ball 15: Held at 250° C. (degrees centigrade) For 30 Seconds In the thus-obtained semiconductor device, the energy-dispersive X-ray spectroscopy (EDS) was used to verify the formation of the Ni—Zn alloy layer 9. Moreover, when the layer thickness of the Ni—Zn alloy layer 9 was verified with the electron microscope, it was about 0.3 μm.

Experiment 2

In accordance with the second embodiment, the semiconductor device was manufactured under the following conditions.
(a) Solder melting condition of Sn—Zn Solder Paste 21: Held at 250° C. (degrees centigrade) For 30 Seconds
(b) Solder melting condition of Sn—Ag—Cu-based solder ball 15: Held at 250° C. (degrees centigrade) For 30 Seconds In the thus-obtained semiconductor device, the energy-dispersive X-ray spectroscopy (EDS) was used to verify the formation of the Ni—Au—Zn alloy layer 22. Moreover, when the layer thickness of the Ni—Au—Zn alloy layer 22 was verified with the electron microscope, it was about 0.15 μm.

Experiment 3

In accordance with the third embodiment, the semiconductor device was manufactured under the following conditions.
(a) Solder melting condition of Sn—Ag—Cu-based solder ball 23 including Zn at 1 weight %: Held at 250° C. (degrees centigrade) For 30 Seconds In the thus-obtained semiconductor device, the energy-dispersive X-ray spectroscopy (EDS) was used to verify the formation of the Ni—Au—Zn alloy layer 22. Moreover, when the layer thickness of the Ni—Au—Zn alloy layer 22 was verified with the electron microscope, it was about 0.1 μm.

Comparison Example 1

Figure 1:
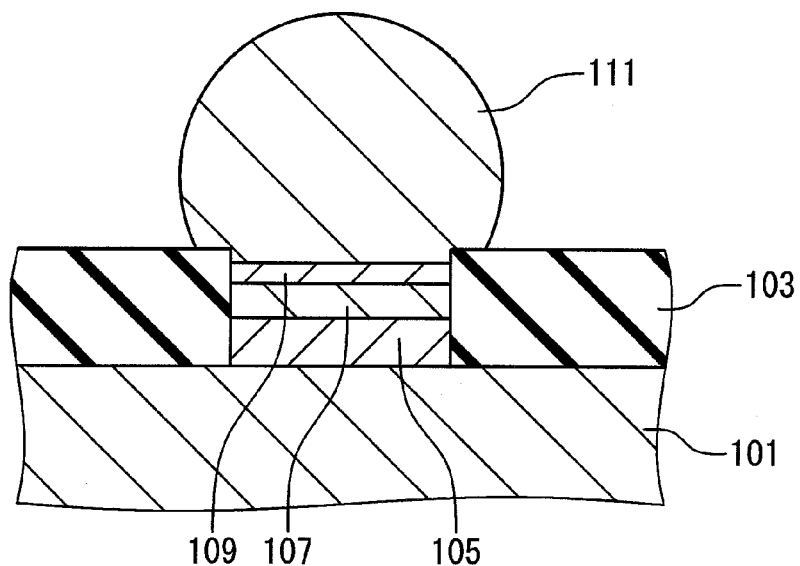
FIG. 1 is a sectional view showing a conventional semiconductor device.
Figure 2:
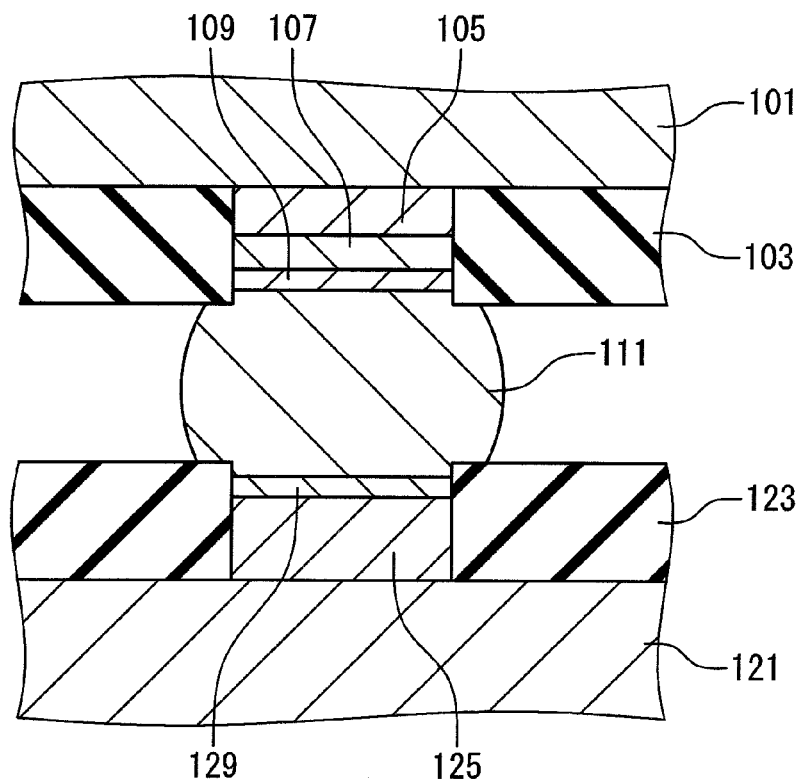
FIG. 2 is a sectional view showing an example where the conventional semiconductor device is installed on a mount substrate.

In accordance with the conventional method, the semiconductor device was manufactured as shown in FIG. 1. In the semiconductor device, the energy-dispersive X-ray spectroscopy (EDS) was used to verify the formation of the alloy layer 109 made of Cu, Ni and Sn. Moreover, when the layer thickness of the alloy layer 109 made of Cu, Ni and Sn was verified with the electron microscope, it was about 1.5 μm.

The semiconductor devices in the experiments 1 to 3 and comparison example 1 obtained as mentioned above were mounted on the mount substrate. Then, same impact was applied from outside to each of these semiconductor devices, and the impact resistances were verified. As a result, in all of the experiments 1 to 3, it was verified that there was no strip between the Ni—Zn alloy layer 9 or the Ni—Au—Zn-based alloy layer 22 and the Sn—Ag—Cu-based solder ball 17 (25) and that the adhesive property was high. On the other hand, in the semiconductor device of the comparison example 1, it was verified that the there was the strip between the alloy layer 109 and the Sn—Ag—Cu-based solder ball 111 and that the adhesive property was low.

In this way, it was verified that the employment of the structure where the Sn—Ag—Cu-based solder ball was installed on the surface of the alloy layer, which included Ni and Zn as the essential components, could make the impact resistance better and improve the connection reliability of the semiconductor device.

According to the present invention, the semiconductor device can be provided, which is superior in the connection reliability to the mount substrate and superior even in the connection reliability for the long term, where the flexibility for selecting the metal material in the mount substrate is improved.

It is apparent that the present invention is not limited to the above embodiment that may be modified and changed without departing from the scope and spirit of the invention.

What is claimed is:

1. A method of manufacturing a semiconductor device comprising:
    (a) forming a solder resist having an opening on a substrate;
    (b) forming a Ni inclusion plating layer inside said opening; and
    (c1) placing a Sn—Ag—Cu-based solder ball including Zn on said Ni inclusion plating layer, and (c2) forming an alloy layer composed of Ni and Zn between said Sn—Ag—Cu-based solder ball and said Ni inclusion plating layer by a heat treatment.

2. The method of manufacturing a semiconductor device according to claim 1, further comprising:
    (d) forming a Cu layer inside said opening on said substrate before forming said Ni inclusion plating layer.

3. The method of manufacturing a semiconductor device according to claim 1, wherein a thickness of said alloy layer is in a range of 0.02 μm to 0.3 μm.

4. The method of manufacturing a semiconductor device according to claim 1, wherein said Sn—Ag—Cu-based solder ball includes Zn at an amount of about 1 weight %.

5. A method of manufacturing a semiconductor device comprising: (a) forming a solder resist having an opening on a substrate; (b) forming a Ni inclusion plating layer inside said opening, wherein said Ni inclusion plating layer is composed of Ni and Au;
- (c1) placing said Sn—Ag—Cu-based solder ball on said Ni inclusion plating layer, and
- (c2) forming said alloy layer composed of Ni, Au and Zn between said Sn—Ag—Cu-based solder ball and said Ni inclusion plating layer by a heat treatment.

6. The method of manufacturing a semiconductor device according to claim 5, further comprising:
- (d) forming a Cu layer inside said opening on said substrate before forming said Ni inclusion plating layer.

7. The method of manufacturing a semiconductor device according to claim 5, wherein a thickness of said alloy layer is in a range of 0.02 µm to 0.3 µm.

8. the method of manufacturing a semiconductor device according to claim 5, wherein said Sn—Ag—Cu-based solder ball includes Zn at an amount of about 1 weight %.

9. A method of manufacturing a semiconductor device comprising:
- (a) providing a substrate including a solder resist having an opening, a Ni inclusion plating layer inside said opening and an Au plating layer on said Ni inclusion plating layer inside said opening;
- (b) placing a Sn—Ag—Cu-based solder ball including Zn on said Au plating layer;
- (c) melting said solder ball by heating said substrate at a temperature equal to or higher than a melting point of said solder ball; and
- (d) forming an alloy layer including Ni, Au and Zn between a Ni layer of said Ni inclusion plating layer and said solder ball, said alloy layer being formed of Ni and Au inside said opening and Zn included in said solder ball.

* * * * *